United States Patent [19]

Webster

[11] Patent Number: 4,602,182

[45] Date of Patent: Jul. 22, 1986

[54] X33 CUT QUARTZ FOR TEMPERATURE COMPENSATED SAW DEVICES

[75] Inventor: Richard T. Webster, Bedford, Mass.

[73] Assignee: The United States of America as represented by the Secretary of the Air Force, Washington, D.C.

[21] Appl. No.: 614,190

[22] Filed: May 25, 1984

[51] Int. Cl.[4] .............................................. H01L 41/08
[52] U.S. Cl. ................................ 310/313 A; 310/361; 333/154
[58] Field of Search ........................... 310/313 A, 361; 333/150, 154, 155, 193

[56] References Cited

U.S. PATENT DOCUMENTS

| | | | |
|---|---|---|---|
| 3,725,827 | 4/1973 | Slobodnik | 333/30 |
| 3,771,072 | 11/1973 | Slobodnik | 333/30 R |
| 3,772,618 | 11/1973 | Slobodnik | 333/30 R |
| 3,818,382 | 6/1974 | Holland et al. | 333/10 |
| 3,886,484 | 5/1975 | Dias | 310/313 A X |
| 3,995,240 | 11/1976 | Kerbel | 310/313 A X |
| 4,109,172 | 8/1978 | O'Connell | 310/313 |
| 4,232,240 | 11/1980 | O'Connell | 310/313 A |

OTHER PUBLICATIONS

R. T. Webster, 1983 Ultrasonics Symposium Presentation, Nov. 2, 1983, (unpublished).
R. Bechmann et al., Proc. of the IRE, 50 1812 (1962), "High-Order Temperature Coefficients of the Elastic Stiffnesses and Compliances of Alpha-Quartz".
H. Goldstein, *Classical Mechanics*, (Addison-Wesley, New York 1950), p. 107.
D. F. Williams et al., 1980 *Ultrasonics Symposium Proceedings*, IEEE Cat. No. 80CH1602-2, p. 429 (1981), "Temperature Stable SAW Devices Using Doubly Rotated Cuts of Quartz".
Robert L. Rosenberg, IEEE Trans. Sonics and Ultrasonics, SU-27, 130 (1980), "Thermal Shearing Effects on the Temperature Stability of SAW Devices".
D. F. Williams et al., Proceedings 35th Ann. Frequency Control Symposium, p. 376 (1981), "The Propagation Characteristics of Surface Acoustic Waves on Singly and Doubly Rotated Cuts of Quartz".

Primary Examiner—Mark O. Budd
Attorney, Agent, or Firm—Donald J. Singer; William Stepanishen

[57] ABSTRACT

An X-cut, 33.44 degree quartz crystal for propagating surface acoustic waves with a temperature stability in the order of $-0.0209$ ppm/$C^2$. The crystal orientation requires only a single rotation (33.44°) from the crystal axes. This orientation is substantially simpler than previously reported cuts with comparable temperature stability which typically require three rotations. The X cut orientation has a surface acoustic wave (SAW) velocity of 3175 m/sec, an electromechanical coupling ($\Delta v/v$) of $4 \times 10^{-4}$, and a power flow angle of 2.7 degrees.

2 Claims, 3 Drawing Figures

X33 CUT QUARTZ FOR TEMPERATURE COMPENSATED SAW DEVICES

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to surface acoustic wave (SAW) devices, and in particular to a X33 cut quartz substrate for temperature compensated surface acoustic wave (SAW) devices.

Surface acoustic waves which contain both compressional and shear components in phase quadrature, propagating nondispersively along and bound to solid surfaces, were discovered in the 1880s. As an example, earthquakes furnish sources for propagating these waves on the Earth's surface. It is of importance for electronic applications that if the solid is a piezoelectric material, the surface acoustic energy is complemented by a small amount of electric energy. This electric energy provides the physical mechanism for the coupling between conventional electromagnetic signals and propagating surface acoustic wave (SAW). The coupling is attained by means of interdigitial transducers (IDT). Surface acoustic wave devices have led to a versatile microminiature technology for analog signal processing in the frequency range $10^7$-$10^9$ Hz. Notable devices include bandpass filters, resonators, oscillators, pulse compression filters, and fast Fourier transform processors. Application areas include the color television consumer market, radar, sonar, communication systems, and nondestructive testing.

The present invention provides an X-cut quartz crystal wherein the orientation of the surface of the quartz crystal is normal to the X crystalline axis as defined by the IRE "Standards on Piezoelectric Crystals, 1949" (*Published in the Proceedings of the IRE*, pp 1378-1395, December 1949).

SUMMARY OF THE INVENTION

The present invention utilizes an X-cut, 33.44 degree quartz substrate for propagating surface acoustic waves with zero temperature coefficient of surface acoustic wave delay at room temperature. The phase velocity of the surface acoustic wave which propagates in the Y-Z plane, is in a direction of 33.44° from the +Y crystalline axis toward the +Z axis. This orientation is described by the Euler angles of lambda=90°, mu=90°, and theta=33.44°.

It is one object of the present invention, therefore, to provide an improved X33 cut quartz substrate for propagating surface acoustic waves.

It is another object of the invention to provide an improved X33 cut quartz apparatus having a zero temperature coefficient of surface acoustic wave delay at room temperature.

It is another object of the invention to provide an improved X33 cut quartz apparatus having a temperature sensitivity of 20.9 parts per billion per degree (centigrade)$^2$.

It is a further object of the invention to provide an improved X33 cut quartz apparatus that is crystalographically easy to orient relative to other quartz orientations with similar temperature characteristics.

These and other advantages, objects and features of the invention will become more apparent from the following description taken in conjunction with the illustrative embodiment in the accompanying drawings.

DESCRIPTION OF THE PREFERRED EMBODIMENT

The theoretical and experimental investigations of surface acoustic wave (SAW) propagation on X-cut quartz reveal that the temperature stability of the X-cut, 33.44 degree propagating orientation is superior to the stability of the commonly used ST-cut quartz. Temperature stable operation is an important requirement when surface acoustic wave (SAW) devices are used for frequency control or for narrowband filtering. Comparisons between surface acoustic wave (SAW) substrate orientations can be made by fitting the propagation time delay to a polynomial of the form $$\frac{\tau - \tau_o}{\tau_o} = A_1(T - T_o) + A_2(T - T_o)^2 + A_3(T - T_o)^3 + \ldots$$

Where $\tau$ is the propagation delay, T is the temperature, $T_o$ is a reference temperature, $\tau_o$ is the delay at $T_o$, and $A_i$ are the temperature coefficients of delay. Temperature compensation occurs for particular crystolographic orientations where the thermal expansion of the crystal is exactly compensated by a thermally induced increase in surface acoustic wave (SAW) velocity leaving the propagation delay unchanged to first order. The reference temperature for which $A_1=0$ is called the turnover temperature.

The temperature compensated X33 orientation was identified by a central difference technique. Surface acoustic wave (SAW) velocities on the X-cut quartz surface were calculated at 15° C., 25° C., and 35° C. by an iterative technique using the elastic constants and their temperature coefficients. The first order temperature coefficient of delay, $A_1$ is then given by $$A_1 = \frac{1}{\tau}\frac{\partial \tau}{\partial T} = \frac{1}{l}\frac{\partial l}{\partial T} - \frac{1}{v}\frac{\partial v}{\partial T}$$

where l is the propagation pathlength, $$\frac{1}{l}\frac{\partial l}{\partial T}$$

is the thermal expansion in the direction of surface acoustic wave (SAW) propagation, v is the surface acoustic wave (SAW) velocity and $$\frac{1}{v}\frac{\partial v}{\partial T} = \frac{v(35) - v(15)}{V(25)}$$

Figure 1:
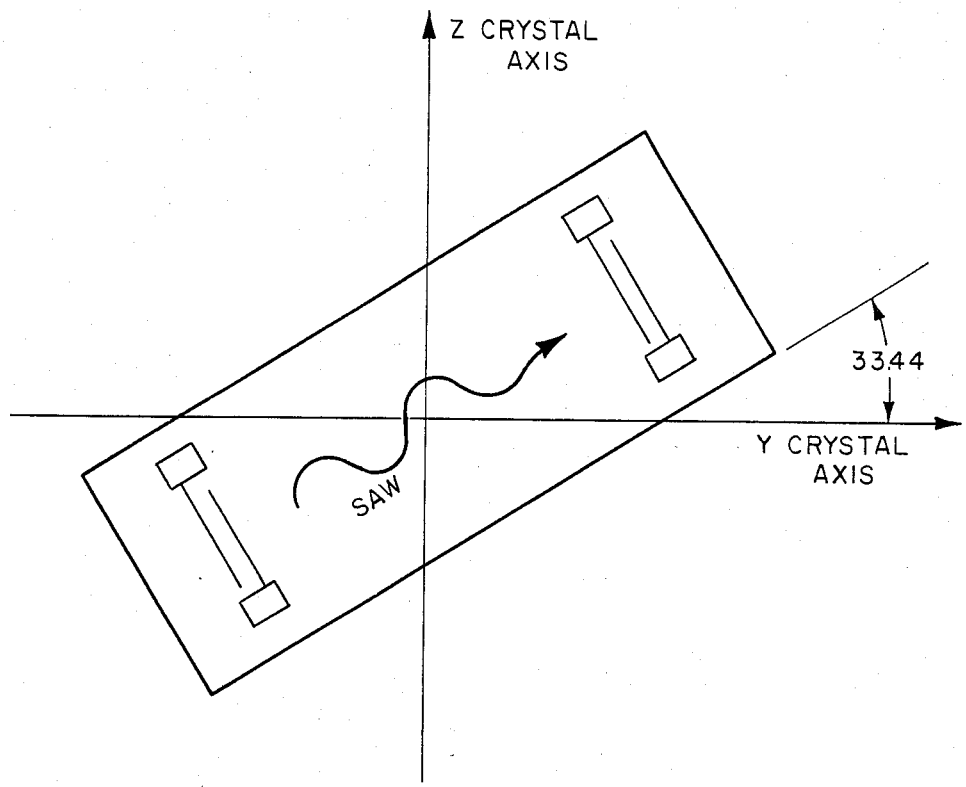
FIG. 1 is an illustration of X33 cut quartz crystal substrate showing an surface acoustic wave (SAW) propagating between two interdigital tranducers.

Referring now to FIG. 1 there is shown an X-cut 33.44 degree quartz crystal which provides the temperature compensated orientation with a turnover at room temperature. The propagation direction lies in the plane defined by the positive Y and positive Z axes rotated 33.44 degrees from the Y axis. The three Euler angles in degrees which describe this orientation are lambda=90, mu=90 and theta=33.44. The ST-cut propagation direction is along the X axis with the surface normal in the Y-Z plane rotated 42.5 degrees from Y. Therefore the cutting of the X33 substrate is of the same order of complexity as the ST-cut. A number of doubly rotated quartz cuts with temperature stability that is superior to ST-cut stability have been identified. The doubly rotated substrates generally require two rotations from the crystal axis to establish the surface normal. A third rotation must be performed to establish the propagation direction. Since surface acoustic wave (SAW) properties can be sensitive to misorientations, close tolerances must be imposed upon all rotation angles. Therefore, the simple X33 cut should be preferable to the doubly rotated cuts from the substrate fabrication of view.

Once the particular orientation with zero first order temperature coefficient of delay was identified, the higher order temperature coefficients were computed. The surface acoustic wave (SAW) velocity and acoustic path lengths were determined at eight temperatures between $-25°$ C. and $100°$ C. These computations provided the thermal shearing effects on propagation direction. A least square polynomial fit of the frequency $(1/\tau)$ vs temperature data yielded the higher order temperature coefficients of frequency.

Table I displays the computed surface acoustic wave (SAW) properties of the X33 cut at 25 degrees celsius and compares them to ST-cut.

TABLE I

COMPARISON OF COMPUTED ROOM TEMPERATURE SURFACE ACOUSTIC WAVE PROPERTIES OF TEMPERATURE COMPENSATED QUARTZ CUTS

| | X33 QUARTZ | ST QUARTZ |
|---|---|---|
| VELOCITY (M/SEC) | 3175 | 3158 |
| DELTA V/V | 3.04E-4 | 5.8E-4 |
| POWER FLOW ANGLE (DEG) | 2.7 | 0 |
| SLOPE OF PFA | 0.530 | 0.378 |
| 2ND ORDER TEMPERATURE COEFFICIENT (PPM/C$^2$) | −0.0209 | −0.037 |

The velocity of X33 quartz is slightly higher than ST while the electromechanical coupling as represented by delta V over V is somewhat lower than ST. For narrowband filter and frequency control applications, the lower coupling would not be a serious drawback. The power flow angle of X33 is 2.7 degrees. That is, the energy carried by the wave travels at an angle 2.7 degrees from the direction of the phase velocity. For ST-quartz there is no such beam steering. The slope of the power flow angle with respect to the direction of the phase velocity is 0.53 for the X33 cut and 0.378 for ST. The larger slope for X33 indicates qualitatively that diffraction effects will be more significant than on ST-cut. The non-zero power flow angle and the larger slope are manifestations of the crystal anisotropy. Proper transducer design can compensate for both. In fact, novel transducer designs may actually improve the overall temperature stability of the device. The final entry in Table I shows the improvement in second order temperature coefficient of frequency obtained by the X33 cut, −0.0209 ppm/C$^2$ compared to −0.0370 ppm/C$^2$ for ST. The lower coefficient yields a wider temperature range for device performance within a specified tolerance of phase or frequency. Alternatively, for ovenized applications, the lower temperature sensitivity reduces the stability requirements on the oven.

Figure 2:
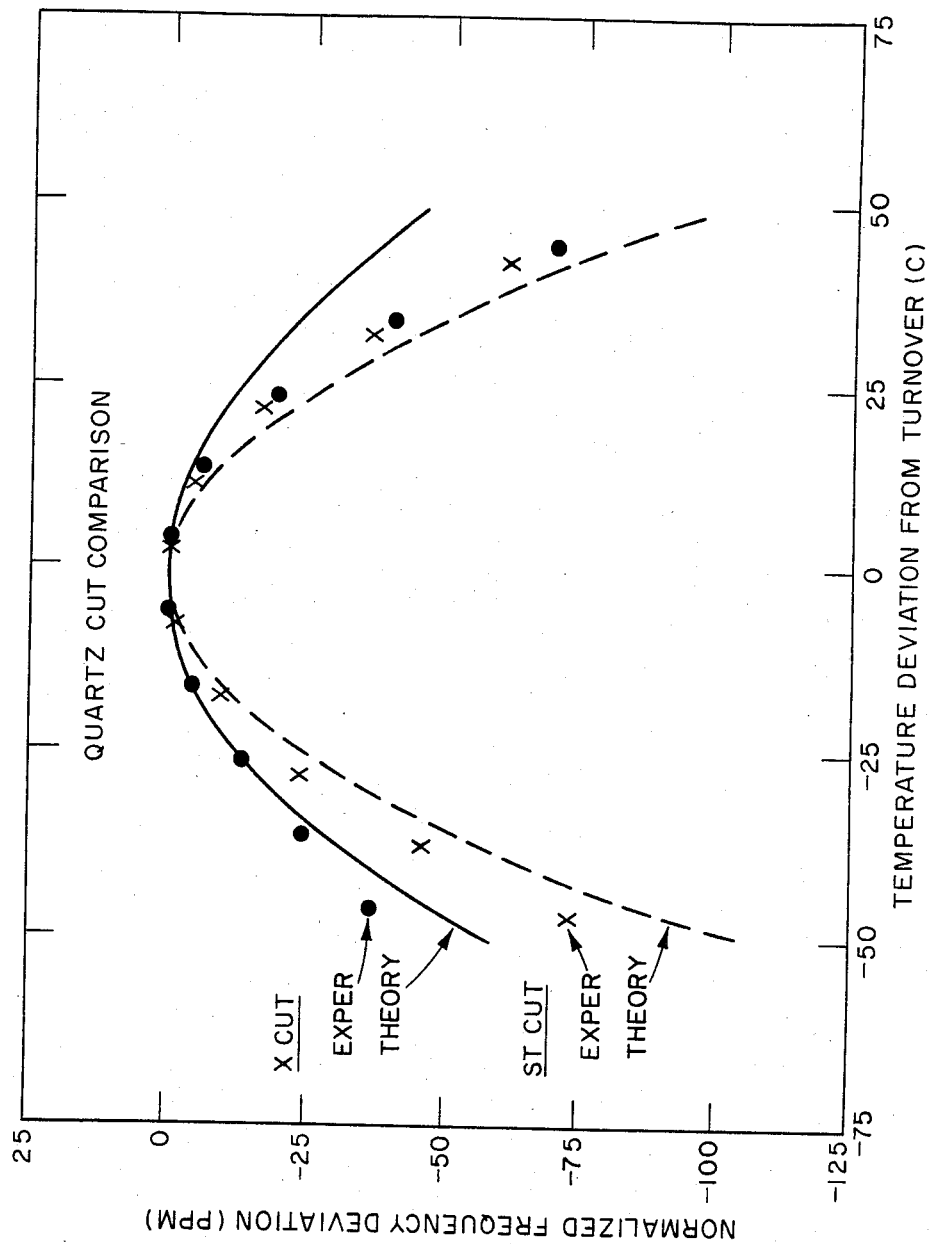
FIG. 2 is a graphical representation of the comparison between X33 quartz and the commonly used ST cut quartz.

Turning now to FIG. 2, there is shown a graphical comparison of the temperature sensitivity of the two cuts. Both experimental and computed results are shown. The horizontal axis represents the deviation from the turnover temperature while the vertical axis is the deviation in frequency from the turnover frequency expressed in parts per million. The experimental results were obtained from delay line oscillator measurements. The X33 experimental points exhibit a higher order temperature dependence that was not predicted by the theory. The discrepancy is believed to be caused by temperature dependent beam steering effects that were not compensated by transducer design.

Figure 3:
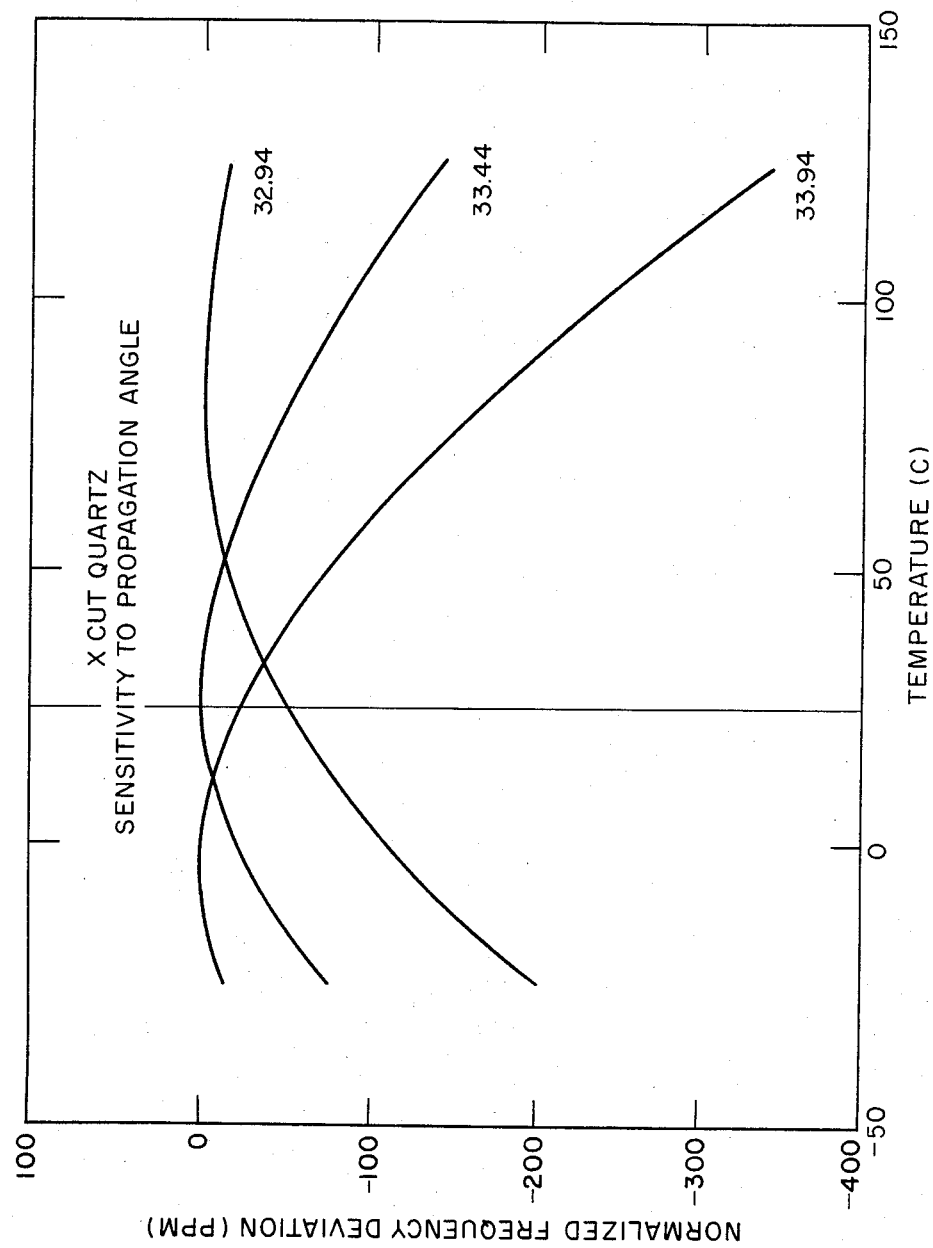
FIG. 3 is a graphical representation of the effect of misorientation of the propagation direction on the temperature characteristics of the X33 cut.

Computations show that misorientation of the quartz substrate surface normal by as much as 0.5 degrees has an insignificant effect on the temperature characteristics of the X33 orientation. However, FIG. 3 shows that the turnover temperature is sensitive to the surface acoustic wave (SAW) propagation direction. The computed curve for 33.44 degree propagation has a turnover at room temperature. For propagation at 32.94 degrees from the Y axis, the turnover is at 86C while for 33.94 the turnover drops to −3C. By contrast, the turnover for ST-quartz has low sensitivity to propagation direction with high sensitivity to the plate normal variations. Thus, using the X33 cut, the turnover temperature can be adjusted to a design tolerance by a simple rotation of the transducer pattern during the photolithographic processing. For ST cut on the other hand, adjusting the turnover requires re-orienting the substrate surface, a much more difficult task. In summary, the X33 orientation offers improvements in temperature sensitivity over the commonly used ST-cut. Since it is a simple X-cut, it is easier to orient than doubly rotated cuts with similar temperature stability.

Although the invention has been described with reference to a particular embodiment, it will be understood to those skilled in the art that the invention is capable of a variety of alternative embodiments within the spirit and scope of the appended claims.

What is claimed is:

1. A surface acoustic wave (SAW) device substrate member of single crystal quartz having an acoustic surface wave propagation surface defined by a plane that substantially coincides with the Euler angles lambda=90°, mu=90°, and theta=33.44°.

2. A surface acoustic wave (SAW) device substrate member of single crystal quartz as described in claim 1 further including an interdigital input and output transducer desposed on said surface parallel and remote from each other, said interdigital input and output transducer are aligned perpendicular to the Xcut 33.44° propagating orientation.

* * * * *